United States Patent [19]

King

[11] Patent Number: 5,015,877
[45] Date of Patent: May 14, 1991

[54] LOW DISTORTION SAMPLE AND HOLD CIRCUIT

[75] Inventor: Ken R. King, Palm Bay, Fla.

[73] Assignee: Harris Corporation, Melbourne, Fla.

[21] Appl. No.: 508,568

[22] Filed: Apr. 13, 1990

[51] Int. Cl.$^5$ .............................................. G11C 27/02
[52] U.S. Cl. ..................................... 307/353; 307/491
[58] Field of Search ............... 307/353, 491, 494, 572; 328/128, 151

[56] References Cited

U.S. PATENT DOCUMENTS

| 4,211,981 | 7/1980 | Lerma .................................. 307/491 |
| 4,404,479 | 9/1983 | Toyomaki .......................... 307/353 |
| 4,636,744 | 1/1987 | King et al. . | |

FOREIGN PATENT DOCUMENTS

| 0030098 | 1/1989 | Japan .................................. 307/353 |
| 0033799 | 2/1989 | Japan .................................. 307/353 |

OTHER PUBLICATIONS

"High Temperature Sample and Hold Amplifier"; Harris Corp., HA-2420-1.
"High Speed Precision Monolithic Sample and Hold Amplifier"; Harris Corp., HA-5320.

Primary Examiner—John Zazworsky
Attorney, Agent, or Firm—Barnes & Thornburg

[57] ABSTRACT

A sample and hold circuit having low distortion at a large full power bandwidth utilizes a compensation capacitor which is connected across the input and output of an output stage of the sample and hold circuit and is driven by the output current signal, i.e. slew current $I_S$, of the input stage. A hold capacitor is also included and arranged in parallel with the compensation capacitor to be voltage driven. The hold capacitor has a capacitance much larger than that of the compensation capacitor and a voltage equal to voltage of the compensation capacitor. A switchable voltage buffer for isolating the hold capacitor from the output of the input stage and for driving the hold capacitor, independently from the slew current, to a voltage value equaling the voltage of the compensation capacitor is also provided.

10 Claims, 1 Drawing Sheet

LOW DISTORTION SAMPLE AND HOLD CIRCUIT

BACKGROUND AND SUMMARY OF THE INVENTION

The present invention generally relates to a sample and hold circuit, and more particularly, a sample and hold circuit having low distortion at a large full power bandwidth.

Typically, a sample and hold circuit has an output which is proportional to the input until a "hold" signal is received. Upon receipt of that signal, the amplifier output is maintained essentially constant even though there may be changes in the input signal.

As shown in FIG. 1, the conceptual design of an integrating sample and hold circuit (Harris part no. HA5320, HA5330 U.S. Pat. No. 4,636,744) comprises a first independent amplifier 1, hereinafter sometimes referred to as the transconductance stage, and a second independent amplifier 2, having a high input impedance, these amplifiers 1, 2 being respectively connected by a sampling switch $S_1$. The transconductance stage provides an output current or slew current $I_S$ which is equal to the transconductance of the first independent amplifier 1 times the voltage of the input signal thereto. With sampling switch $S_1$ closed, a hold capacitor $C_H$, connected at respective ends to the input and output terminals of the second amplifier 2, is charged by the slew current $I_S$ when an input signal is applied to the input of the first amplifier 1.

Upon receipt of the "hold" command, the sampling switch $S_1$ is opened, thus leaving the hold capacitor $C_H$ charged at the instantaneous value of the input signal. Capacitor $C_H$ is not discharged because the second amplifier 2 has a high input impedance so that the output of the second amplifier 2 remains essentially steady for a period of time. The "hold" signal may be generated by an external circuit (coupled to a process or experiment) or by a computer or digital control unit under control of the storage program.

The integrating type sample and hold circuitry illustrated in FIG. 1 is advantageous due to the switch stage operating at virtual ground. This allows for a charge injection compensation, leakage cancellation, signal independent pedestal error and the like. The hold capacitor $C_H$ must be large in order to store charge to accomplish the sample and hold function and unfortunately, the hold capacitor $C_H$ must be slewed by the transconductance stage under large signal conditions. This is disadvantageous because to achieve a large full power bandwidth of, for example, 500 kHz, along with a sizable hold capacitor $C_H$, the front end slewing current $I_S$ must be unreasonably large.

Assume a full power bandwidth (FPBW) defined as as follows:

$$FBPW = \frac{SR}{2\pi} V_a$$

wherein SR=the slew rate, $V_a$=sine wave amplitude and the slew rate is the same as the droop rate. Thus, for a full power bandwidth of 500 kHz at low distortion, the slew rate must be even greater than what is assumed above and thus the slew current would also be even greater.

For the sake of discussion, assume a factor of 2.0 slew rate advantage. Thus, the slew rate minimum is 500 Hzk×2×$\pi$ which equals 31.4 V/uS and for low distortion use 2.0×31.4 V/microseconds which equals 62.8 V/microseconds. Assuming a hold capacitance of 110 pf, the parasitic capacitance of 10 pf gives a total slew capacitance of 120 pf. The slew current necessary is thus:

$$I_{slew} = 62.8 \text{ V/microseconds} \times 120 \text{ pf} = 7.52 \text{ mA}.$$

This is a very large current value to bias a differential pair on a circuit with a total current supply in the 10 mA range.

Therefore, it is an object of the present invention to eliminate the need to drive the hold capacitor of an integrating type sample and hold circuit with the slew current provided at an output of a transductance stage of the sample and hold circuit.

It is a further object of the present invention to eliminate the need for any distortion producing slew enhancement stages to provide a good full power bandwidth with low distortion.

It is yet another object of the present invention to provide a sample and hold circuit in which the front end is biased at a more reasonable current and a greater full power bandwidth is achieved.

These and other objects are provided, in accordance with preferred embodiments of the present invention, by a sample and hold circuit having low distortion at a large full power bandwidth, the circuit comprising an input stage having at least an input for receiving a signal to be sampled and an output for providing an output signal representative of an instantaneous value of the signal to be sampled. Connected via a sampling switch to the output of the input stage is an output stage having a compensation capacitor which is driven by the output signal, i.e. slew current $I_S$, of the input stage. The compensation capacitor has a charge value or voltage representative of the instantaneous value of the output signal of the input stage, the compensation capacitor being connected across the input and output of the output stage. A hold capacitor is also included and arranged in parallel with the compensation capacitor. The hold capacitor has a capacitance much larger than that of the compensation capacitor and a voltage equal to voltage of the compensation capacitor. A switchable voltage buffer for isolating the hold capacitor from the output of the input stage and for driving the hold capacitor to a voltage value equaling the voltage of the compensation capacitor is also provided, the voltage buffer deriving its current independently from the slew current $I_S$.

This arrangement combines the advantages of an integrating type sample of hold circuit with the advantages of a buffer type sample of hold circuit. In that one of the major disadvantages of the integrating type of sample and hold circuit is that the hold capacitor also doubles as the compensation capacitor, preferred embodiments of the present invention avoid the need to drive the hold capacitor with the transductance stage slew current $I_S$ by buffering the hold capacitor with a voltage buffer and providing a compensation capacitor, with a small capacitance which is slewed by the slew current $I_S$ of the transconductance stage so as to greatly reduce the slew current requirements. This arrangement allows the compensation capacitor to be made as small as possible for bandwidth needs and the hold capacitor as large as needed for the sample and hold requirements. Thus, the hold capacitor is driven by a voltage provided by the voltage buffer and not the slew current $I_S$ and therefore slewing does not occur at the hold capacitor but only at the smaller compensation capacitor.

This arrangement further provides the advantage that, because the compensation capacitor can be much smaller than the hold capacitor, the slew current $I_S$ needed to drive the compensation capacitor is reduced. Moreover, there is an elimination of the need for any distortion producing slew enhancement stages and a good full power bandwidth is achieve with lower power.

Thus, the performance improvements provided by preferred embodiments of the present invention include a reduction in the power requirements for achieving a given large power bandwidth, a greater full power and small signal bandwidth as well as improved hold characteristics resulting from a large hold capacitor. As a result, increasing the hold capacitor no longer causes bandwidth and speed trade-offs, specifically, lower drop rate, lower pedestal error, as well as lower drift current requirements. Further, low distortion is provided because no slew enhancement circuit or parallel circuits are needed to achieve the high slew rate and high full power bandwidth, and improved acquisition time is achieved resulting from the high slew rate and high power bandwidth combination.

Other objects, advantages and novel features of the present invention will become apparent from the following detailed description of the invention when considered in conjunction with the accompanying drawings.

DETAILED DESCRIPTION OF THE DRAWINGS

Figure 1:
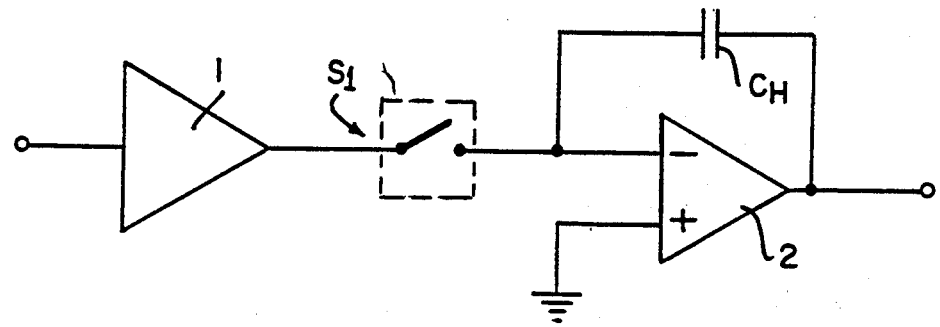
FIG. 1 illustrates a prior art integrating sample hold circuit.
Figure 2:
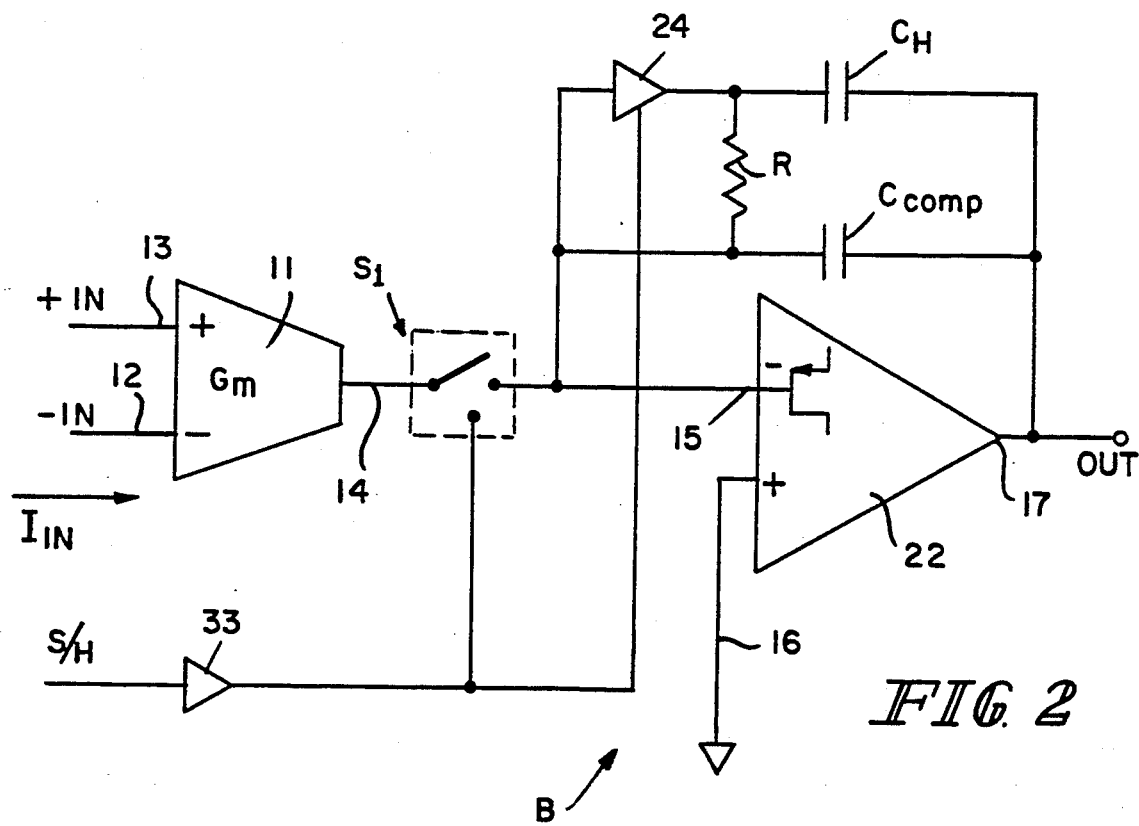
FIG. 2 illustrates a sample and hold circuit diagram in according with one embodiment of the present invention wherein the hold capacitor is buffered.

Referring to FIG. 2, one embodiment of the present invention is illustrated comprising an integrating type sample and hold circuit, generally shown at B, which includes a transconductance stage 11, comprising an amplifier having a negative input 12, a positive input 13 and an output 14. A sampling switch $S_1$ connects the output 14 of transconductance stage 11 with, for example, a negative input 15 of an operational amplifier 22 having a large input impedance, a positive input 16 connected, for example, to ground and an output 17. A compensation capacitor $C_{comp}$ is connected at respective ends of the negative input 15 and the output 17 of the operational amplifier 22. A sample and hold switching amplifier 33 has an output which provides a signal to open and close the sampling switch $S_1$ to control the flow of current to the compensation capacitor $C_{comp}$ so that the charge value, i.e. voltage, of the compensation capacitor $C_{comp}$ follows the output of the transconductance stage 11 during sampling, i.e. sampling witch $S_1$ is closed, and is held at a given value during a "hold" signal, i.e. sampling switch $S_1$ is open.

The sample and hold circuit B is also provided with a hold capacitor $C_H$, which is connected in parallel with the compensation capacitor $C_{comp}$ and isolated from the output 14 of the transconductance stage 11 by a switchable voltage buffer 24. The switchable voltage buffer 24 provides a voltage output which drives the hold capacitor $C_H$ to a voltage value equalling the voltage across the compensation capacitor $C_{comp}$ without the need to charge the hold capacitor $C_H$ using the slew current $I_S$ generated at the output 14 of the transconductance stage 11.

The connection completing the parallel combination of the hold capacitor $C_H$ and the compensation capacitor $C_{comp}$ is accomplished by a simple resistor R. This arrangement permits the operational amplifier 22 to sense the voltage of the hold capacitor $C_H$ during a "hold" signal. Further, the compensation capacitor $C_{comp}$ is provided with a capacitance which is preferably small compared to the capacitance of the hold capacitor $C_H$ so that a large voltage value can be imparted to the compensation capacitor $C_{comp}$ by a relatively small slew current $I_S$ without the need for charge injection. Typically, the compensation capacitor $C_{comp}$ is in the range of about 5 to about 15 pf and the hold capacitor is in the range of about 100 to about 150 pf.

The sample and hold switching amplifier 33 also has its output connected to the switchable voltage buffer 24 so that upon initiation of the "hold" signal by the sample and hold switching amplifier 33, the voltage buffer 24 is switched off and the voltage of the hold capacitor $C_H$ is held at a voltage equalling the voltage across the compensation capacitor $C_{comp}$. Once the switchable voltage buffer 24 is switched off the operational amplifier 22 senses the voltage across the hold capacitor $C_H$ at its input 15 via the resistor R to provide an output signal at output 17 which is representative of the charge of the hold capacitor $C_H$.

In operation, an input signal $I_{in}$ is received at one of the inputs 12, 13 of the transconductance stage 11 which results in an output, or slew current $I_S$, at the output 14 which is representative of an instantaneous value of the input signal $I_{in}$. Because the sampling switch $S_1$ is closed during the sampling mode, the integrating slew current $I_S$ drives the compensation capacitor $C_{comp}$ so that the instantaneous charge, i.e. voltage, across the compensation capacitor $C_{comp}$ is representative of the instantaneous value of the slew current $I_S$. The voltage buffer 24 is switched on during the sampling mode and charges the hold capacitor $C_H$ with a voltage equalling the instantaneous charge value of the compensation capacitor $C_{comp}$ while isolating the hold capacitor $C_H$ from the output 14 of the transconductance stage 11. Thus, the hold capacitor $C_H$ is slewed by the voltage buffer 24 which derives its current from a supply independent of the slew current $I_S$.

Upon receipt of a "hold" command, generated by the sample and hold switching amplifier 33, sampling switch $S_1$ is opened and the charge across the compensation capacitor $C_{comp}$ is held to the value present at the moment the sampling switch $S_1$ is opened. Concurrently, the voltage buffer 24, which isolates the hold capacitor $C_H$ from the output 14 of the transconductance stage 11, is switched off so that the voltage across the hold capacitor $C_H$ is held at the present voltage across the compensation capacitor $C_{comp}$.

The operational amplifier 22 senses the charge value of the hold capacitor $C_H$ at the negative input 15 thereof via the resistor R to provide an output signal at output 17 indicative of this charge value. Further, the output 17 of the operation amplifier 22 remains constant at a value representative of the voltage value across the hold capacitor $C_H$ due to the large capacitance of the hold capacitor $C_H$.

For any given slew current $I_S$, the large signal bandwidth of the sample and hold circuit B is greatly increased by the addition of the buffered hold capacitor $C_H$ shown in FIG. 2 and permits a hold capacitor $C_H$ which may be as large as needed for the sample and hold requirements. The addition of the voltage buffer 24 also ensures that the voltage across the two capacitors, $C_H$ and $C_{comp}$, will be the same. The slew current $I_S$ now has to only slew the capacitor $C_{comp}$ due to the addition of the circuitry indicated above and thus the large signal bandwidth of the sample and hold circuit B is greatly increased and low distortion can be achieved using the excess current available.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed is:

1. A sample and hold circuit having low distortion at a large full power bandwidth comprising
    an input stage having input and an output for providing an output signal;
    an output stage having an input which is switchably connected to the output of the input stage, and an output for generating an output signal;
    a sampling switch switchably connecting the output of the input stage with the input of the output stage;
    a compensation capacitor connected across the input and output of the output stage to be driven by current during sampling;
    a series connected voltage buffer and a hold capacitor connected across the input and output of the output stage in parallel with the compensation capacitor;
    said voltage buffer isolating the hold capacitor from the output of the input stage and charging the hold capacitor to a voltage value equalling an instantaneous voltage value of the compensation capacitor.

2. A sample and hold circuit according to claim 1, wherein the voltage buffer is a switchable voltage buffer which is switched off when the sampling switch is opened; and
    including a resistance having one terminal thereof connected between the voltage buffer and the hold capacitor and another terminal thereof connected between the compensation capacitor and the sampling switch.

3. A sample and hold circuit according to claim 1, wherein the hold capacitor has a capacitance greater than a capacitance of the compensation capacitor.

4. A sample and hold circuit according to claim 1, including a resistance having one terminal thereof connected between the voltage buffer and the hold capacitor and another terminal thereof connected between the compensation capacitor and the sampling switch.

5. A sample and hold circuit according to claim 1, wherein the output signal of the input stage is a current.

6. A sample and hold circuit according to claim 5, wherein the voltage buffer charges the hold capacitor independently of the current of the output signal of the input stage.

7. A sample and hold circuit according to claim 6, wherein the hold capacitor has a capacitance greater than a capacitance of the compensation capacitor.

8. A sample and hold circuit according to claim 7, including a resistance having one terminal thereof connected between the voltage buffer and the hold capacitor and another terminal thereof connected between the compensation capacitor and the sampling switch.

9. A sample and hold circuit according to claim 1, further comprising a sample and hold switching amplifier for generating an output signal for providing a hold command to the sampling switch to open the sampling switch and a sampling command for closing the sampling switch.

10. A sample and hold circuit according to claim 9, wherein said voltage buffer is a switchable buffer; and
    wherein the output signal of the sample and hold switching amplifier shuts off the voltage buffer when the output of the sample and hold switching amplifier is generating a hold command.

* * * * *